United States Patent [19]
Kitamura

[11] Patent Number: 5,981,997
[45] Date of Patent: Nov. 9, 1999

[54] HORIZONTAL FIELD EFFECT TRANSISTOR AND METHOD OF MANUFACTURING THE SAME

[75] Inventor: Akio Kitamura, Nagano, Japan

[73] Assignee: Fuji Electric Co., Ltd., Kawasaki, Japan

[21] Appl. No.: 08/821,460

[22] Filed: Mar. 21, 1997

[30] Foreign Application Priority Data

Mar. 22, 1996 [JP] Japan .................................. 8-065746

[51] Int. Cl.⁶ .......................... H01L 29/76; H01L 29/94; H01L 31/062
[52] U.S. Cl. ............................ 257/335; 257/336; 257/343
[58] Field of Search ................................ 257/335, 337, 257/338, 339, 340, 343, 344

[56] References Cited

U.S. PATENT DOCUMENTS 4,712,124  12/1987  Stupp ..................................... 257/343

*Primary Examiner*—Wael M. Fahmy
*Attorney, Agent, or Firm*—Baker & Botts, L.L.P.

[57] ABSTRACT

The present invention relates to a horizontal field effect transistor including a semiconductor substrate of a first conductivity type, a well region of a second conductivity type formed in a surface layer of the substrate, a source region of the first conductivity type formed in the well region, a drain region of the first conductivity type formed in the well region separated from the source region, a gate electrode disposed via a gate insulating film on a top surface of the substrate between the source region and the drain region, a source electrode disposed to contact a surface of the source region, a drain electrode disposed to contact a surface of the drain region, and a first and second offset region of the first conductivity type formed to contact the drain region, wherein an end of the first offset region and an end of the second offset region, close to the source region, are offset from each other.

10 Claims, 3 Drawing Sheets

HORIZONTAL FIELD EFFECT TRANSISTOR AND METHOD OF MANUFACTURING THE SAME

RELATED APPLICATION

This application is related to an allowed application entitled "Lateral Field Effect Transistor and Method of Manufacturing the Same," U.S. application Ser. No. 08/926,343, filed Sep. 9, 1997, which is a continuation of U.S. application Ser. No. 08/534,013, filed Sep. 26, 1995, now abandoned.

FIELD OF THE INVENTION

The present invention relates to a horizontal field effect transistor ("FET") having a high voltage endurance and a low on-resistance which is used in power supplies or automobiles to drive a motor or display panel, or which is integrated into a logic section as a power IC.

BACKGROUND OF THE INVENTION

In the field of horizontal FETs of high voltage endurance and low on-resistance, there have been constant attempts to improve the results of the inevitable tradeoffs between voltage endurance and on-resistance per unit. In the following description, (n) or (p) preceding layer or region names indicates that electrons or holes, respectively, are majority carriers in those layers or regions.

FIG. 5 shows a cross-section of a p-channel type DMOS-FET which is an example of a conventional horizontal FET. The p-type substrate 401 is a silicon wafer with a resistivity of 15 Ω·cm. N-type impurities, e.g., phosphorus, are injected into the surface layer of the p-type substrate 401 to form n well region 402. The n well region 402 has a surface concentration of $3 \times 10^{16}$ cm$^{-3}$ and a diffusion depth $x_j$ of about 4 μm. In addition, an n base region 405, a p offset region 406, a p source region 403 and a p drain region 404 are formed on the surface of the n well region 402 by selective ion injection, using a mask. The n base region 405 has a surface concentration of $1 \times 10^{17}$ cm$^{-3}$ and a diffusion depth $x_j$ of about 1 μm. The p offset region 406 has a surface concentration of $5 \times 10^{16}$ cm$^{-3}$ and a diffusion depth $x_j$ of 0.6 μm.

A gate electrode 408 is formed on a gate oxide film 407, and its drain side is formed on a thick oxide film LOCOS 409. The p offset region 406 (the drain drift region) protrudes about 1 μm from the LOCOS 409 towards the source side. The distance Lga between the gate electrode 408 and the LOCOS 409 is about 2 μm, and the length LLOCOS of the LOCOS 409 is about 1 μm.

For voltage resistance of several tens of volts, attempts have been made to improve the tradeoffs by further shrinking the elements (reducing the gate length Lga or a drain drift length Ld≈LLOCOS) or by optimizing the concentration of impurities in the p offset region 406 and the n base region 405. In the p-channel type MOSFET, however, since the gate length Lga is reduced and the concentration of the p offset region 406 is increased, punchthrough voltage endurance is significantly degraded, preventing any further reduction in the size of the elements. Punchthrough voltage resistance is improved by increasing the base concentration (the concentration of impurities in the base region), but the increase in base concentration may raise threshold voltage, and thus channel resistance, when a gate drive voltage is constant.

The object of this invention is to provide a horizontal FET with high voltage endurance and low on-resistance in which the tradeoff between voltage endurance and on-resistance is improved by improving punchthrough voltage endurance or by further reducing the size of elements to reduce on-resistance.

SUMMARY OF THE INVENTION

In order to solve this problem, this invention provides a horizontal field effect transistor including a semiconductor substrate of a first conductivity type; a well region of a second conductivity type formed in a surface layer of the substrate; a source region of the first conductivity type formed in the well region; a drain region of the first conductivity type formed in the well region separated from the source region; a gate electrode disposed via a gate insulating film on a top surface of the substrate between the source region and the drain region; a source electrode disposed to contact a surface of the source region; a drain electrode disposed to contact a surface of the drain region; and a first and second offset region of the first conductive type formed to contact the drain region, wherein an end of the first offset region and an end of the second offset region, close to the source region, are offset from each other.

In this configuration, the portion of the offset region constituting the drain drift layer, closer to the source region and having low surface impurity concentration, is easily depleted, while the overlapping portion of these two offset regions is difficult to deplete, thereby improving punchthrough voltage endurance.

Preferably, the first offset region with lower surface impurity concentration extends closer to the source region than the second offset region of higher surface impurity concentration, so that the first offset region is easily depleted, whereas the second offset region is difficult to deplete, thereby improving punchthrough voltage endurance. Alternatively, the first offset region is formed over the entire surface of the element.

Furthermore, it is preferable to provide a thick insulating film for reducing electric fields disposed under the gate electrode, close to the drain region. In this configuration, the electric fields under the thick insulating film are reduced to allow punchthrough voltage endurance to be improved.

The second offset region may be formed mainly under the thick insulating film. In this configuration, a selection mask used to form a thick insulating film can be used to form the second offset region.

If the thick insulating film has the identical specifications as another thick insulating film for separating other element portions from one another or for preventing inversion, these films can be formed simultaneously.

A method for manufacturing a horizontal field effect transistor having two offset regions of a first conductivity type contacting drain region of a first conductivity type, in which the first offset region with lower surface impurity concentration extends closer to a source region of the first conductivity type than the second offset region of higher surface impurity concentration; and in which a thick insulating film for reducing electric fields is disposed under the gate electrode, close to the drain region, with the second offset region formed mainly under the thick insulating film, consists of the steps of forming an oxide film and a nitride film on a silicon substrate, using a thick insulating film formation mask to remove the nitride film selectively, injecting impurity ions through a window formed to form the first offset region, and undertaking thermal treatment in an oxidized atmosphere to form a second offset region and forming a thick insulating film on the surface of the second offset region. Such a manufacturing method eliminates the need for a mask formation step for forming the second offset region.

As described above, this invention provides a horizontal FET of high voltage endurance and low on-resistance. It is characterized by two offset regions, formed to contact a drain region so that their ends close to the source region are offset from each other. This innovation has the following effects:

a. Punchthrough voltage endurance is improved. If the voltage endurance of the FET remains unchanged, the size of elements can be further reduced.

b. The use of a self-align technique and an all-surface diffusion eliminates use of a mask offset margin. This enables size to be further reduced.

c. Drain drift resistance is reduced to reduce on-resistance.

These effects serve to provide a horizontal FET with improved tradeoffs between voltage endurance and on resistance.

Hereinafter, the present invention will be explained with reference to the accompanied drawing figures which illustrate preferred embodiments of the invention.

DESCRIPTION OF PREFERRED EMBODIMENTS

Figure 1:
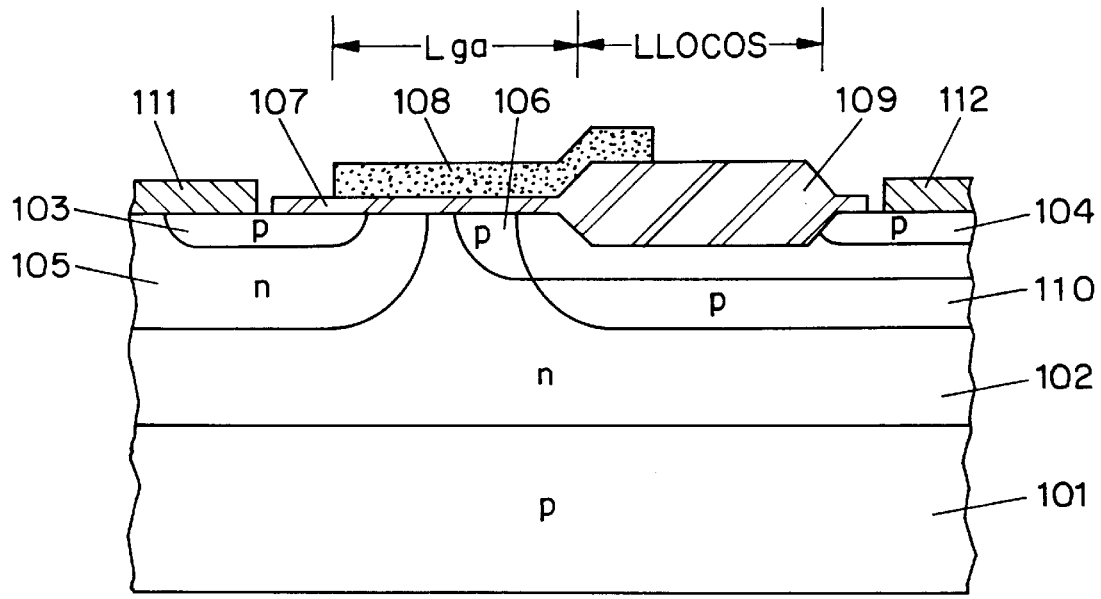
FIG. 1 is a cross-sectional view of a p-channel type DMOSFET according to a first embodiment of the present invention.
Figure 5:
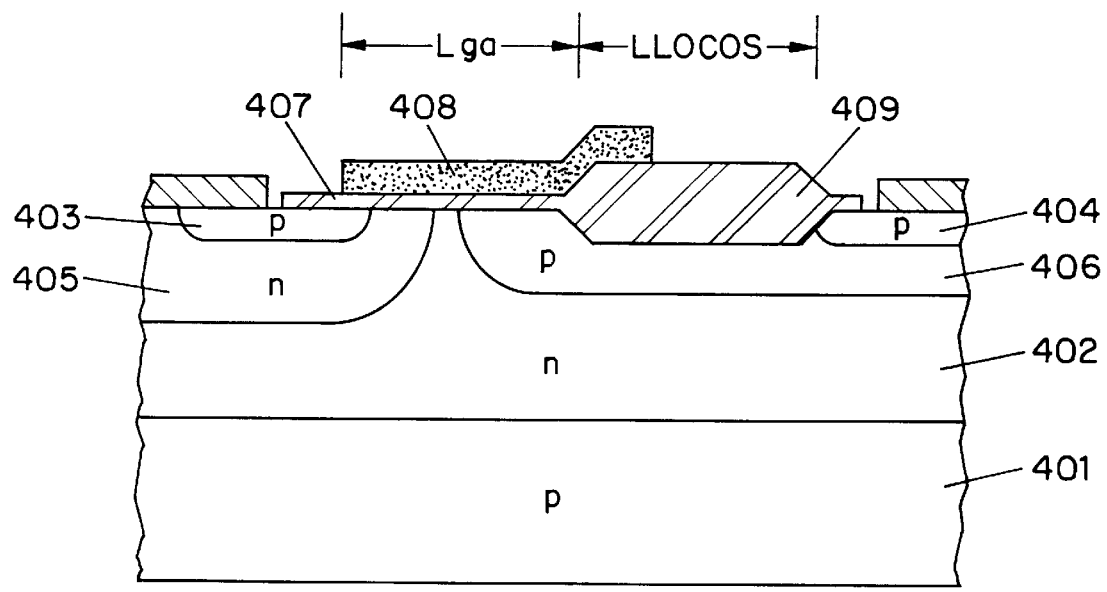
FIG. 5 is a cross-sectional view of a conventional p-channel type DMOSFET.

FIG. 1 is a cross-sectional view of a horizontal p-channel type DMOSFET, according to a first embodiment of the present invention. A p-type substrate 101 is a silicon wafer with a resistivity of 15 Ω·cm. Phosphorus ions are injected as n-type impurities into the surface layer of the p-type substrate 101 to form an n well region 102. The n well region 102 has a surface concentration of $3 \times 10^{16}$ cm$^{-3}$ and a diffusion depth $x_j$ of about 4 μm. In addition, n- and p-type impurities are injected into the surface layer of the n well region 102 to form an n base region 105, a p offset region 106, a second p offset region 110, a p source region 103 and a p drain region 104. This FET differs from the conventional horizontal FET shown in FIG. 5 in that the second p offset region 110 partly overlaps p offset region 106. The n base region 105 has a surface concentration of $1 \times 10^{17}$ cm$^{-3}$ and a diffusion depth $x_j$ of about 1 μm. In addition, the p offset region 106 has a surface concentration of $5 \times 10^{16}$ cm$^{-3}$ and a diffusion depth $x_j$ of about 0.6 μm, and the second p offset region 110 has a surface concentration of $7 \times 10^{16}$ cm$^{-3}$ and a diffusion depth $x_j$ of about 1.0 μm. The area in which the p offset region 106 and the second p offset region 110 overlap each other has a surface concentration of $1.2 \times 10^{17}$ cm$^{-3}$, which is the sum of both impurity concentrations. The p source region 103 and the p drain region 104 both have surface concentrations of $1 \times 10^{20}$ cm$^{-3}$ and diffusion depth $x_j$ of about 0.3 μm. A source electrode 111 and a drain electrode 112, both made of aluminum alloy, are disposed on the p source region 103 and on the p drain region 104, respectively.

A gate electrode 108 of polycrystal silicon is disposed on the silicon substrate via a gate oxide film 107 to extend from the p source region 103 to the p offset region 106. A thick oxide film LOCOS 109 is formed on the surface of the p offset region close to p drain region 104. The p offset region 106 extends about 1 μm from the LOCOS 109 toward the p source region 103.

The second p offset region 110 is formed so that its edge is located about 0.7 μm away from the edge of the p offset region 106 toward the drain side. The distance Lga between the gate electrode 108 and the LOCOS 109 is about 2 μm, and the length LLOCOS of the LOCOS 109 is about 1 μm.

The structure of the horizontal FET in FIG. 1 is manufactured using the following process. Phosphorus, an n-type impurity, is diffused in the surface layer of the p-type substrate 101 to form n well region 102. A selective mask of a photoresist or an oxide film is formed on the surface of the n well region 102, and phosphorus and boron ions are injected and thermal treatment undertaken to form n base region 105, p offset region 106 and the second p offset region 110. An oxide film is formed on the surface, a nitride film is deposited thereon and the nitride film is partially removed by photo etching. The surface layer is then subjected to thermal treatment in an oxidized atmosphere to form the LOCOS 109 of a thick oxide film. The nitride film is removed and the oxide film is partially removed. Boron ions are injected and thermal treatment undertaken to form the p source region 103 and the p drain region 104. The oxide film on the surface of the silicon substrate is removed while leaving the LOCOS 109, and the surface layer is then oxidized to form gate oxide film 107. A polycrystal silicon film is deposited on gate oxide film 107 and LOCOS 109 by a pressure-reducing CVD method, and patterned to provide the gate electrode 108. An opening is formed in the oxide film on the p source region 103 and p drain region 104, and aluminum alloy is sputtered and patterned to provide source electrode 111 and drain electrode 112. Finally, the surface layer may be covered with a passivation film.

During an off period, the p offset region 106 is responsible for voltage endurance. A depletion layer extends from the pn junction between the n well region 102 and the p offset region 106. The p offset region 106 is depleted easily due to its low impurity concentration. However, once the depletion layer has reached the second p offset region 110, it is kept from extending further because of its increased impurity concentration (that is, the impurity concentration of the p offset region 106: $5 \times 10^{16}$ cm$^{-3}$+the impurity concentration of the second p offset region 110: $7 \times 10^{16}$ cm$^{-3}$=the surface concentration: $1.2 \times 10^{17}$ cm$^{-3}$.) The result is that punchthrough voltage endurance is improved.

During an on period, holes are deposited in the surface layers of p offset region 106 and the second p offset region 110 immediately below gate electrode 108, reducing drain drift resistance.

The values for voltage resistance and on-resistance per unit area (RonA) of a horizontal FET provided with the second p offset region 110 are improved over previous technology. Voltage endurance is increased from 20 V to 30 V. RonA is decreased from 0.34 Ω·mm$^2$ to 0.25 Ω·mm$^2$.

Figure 2:
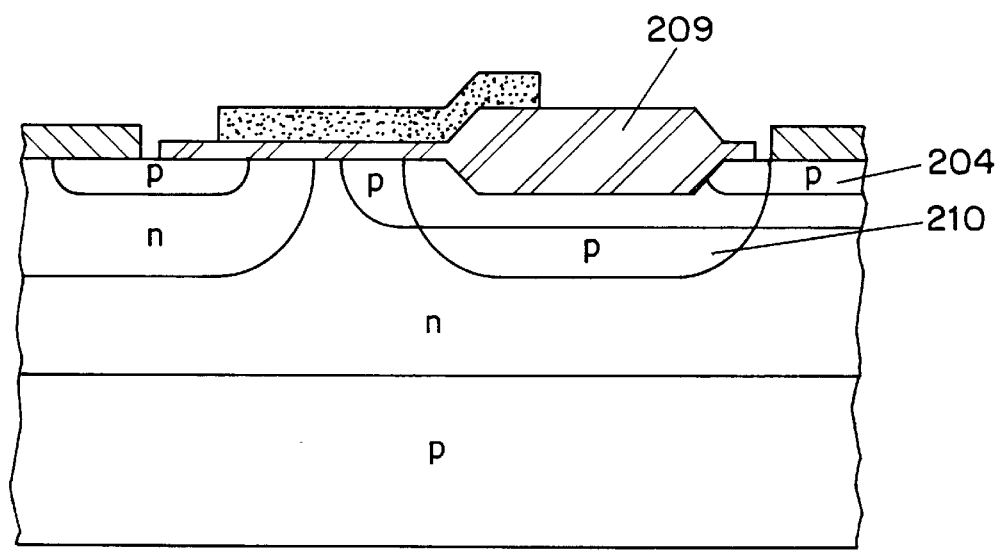
FIG. 2 is a cross-sectional view of a p-channel type DMOSFET according to a second embodiment of the present invention.

FIG. 2 is a cross-sectional view of a horizontal p-channel type DMOSFET according to a second embodiment of this invention. In this embodiment, a second p offset region 210 does not cover all of a p drain region 204 but is formed mainly under a LOCOS 209. The second p offset region 210 has the same surface impurity concentration and diffusion depth as that of the first embodiment.

To provide this structure, the second p offset region 210 may be formed using a mask used to form the LOCOS 209. Specifically, to form the LOCOS 209, a base oxide film is formed as a base and a nitride film is deposited thereon. After that part of the nitride film in which the LOCOS 209 is formed has been removed using the mask used to form the LOCOS 209, boron ions are injected to form the second p offset region 210. A LOCOS 209 formation step (oxidization) is then executed. In this case, the boron atoms are driven deep to form the second p offset region 210, while the thick LOCOS 209 is formed on the surface of the region 210. Thus, unlike the first embodiment, this embodiment permits omitting the process for forming a mask for the second p offset region 210.

In this example, the two offset regions also restrain the spread of the depletion layer to improve punchthrough voltage endurance during an off period. The on-resistance during an on period is also reduced through a reduction in the drain drift resistance.

Figure 3:
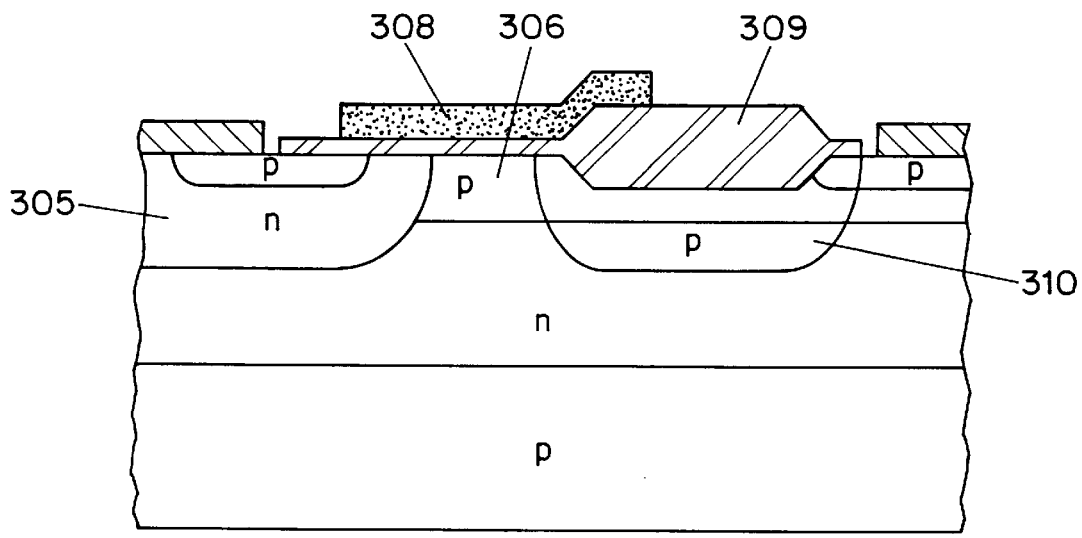
FIG. 3 is a cross-sectional view of a p-channel type DMOSFET according to a third embodiment of the present invention.

FIG. 3 is a cross-sectional view of a horizontal p-channel type DMOSFET according to a third embodiment of this invention. In this embodiment, a p offset region 306 is formed over the entire element. In addition, a second p offset region 310 is formed mainly under a LOCOS 309. The second p offset region 310 has the same surface impurity concentration and diffusion depth as that of the first embodiment.

In this structure, a joined FET serves to prevent drain drift resistance from increasing during an on period. Thus, this structure reduces on-resistance more actively than the element structure shown in FIG. 2. The n base region 305 is self-aligned using gate electrode 308, the p offset region 306 does not require a mask and the second p offset region 310 is self-aligned using a LOCOS formation mask. This structure makes it unnecessary to consider degradation of elements and does not require a mask offset margin. It helps in further reducing the size of elements.

Thus, the values for voltage endurance and on-resistance per unit (RonA) of the horizontal FET according to the third embodiment are improved. Voltage endurance is increased to 34 V and RonA is decreased to 0.17 $\Omega \cdot mm^2$.

Figure 4:
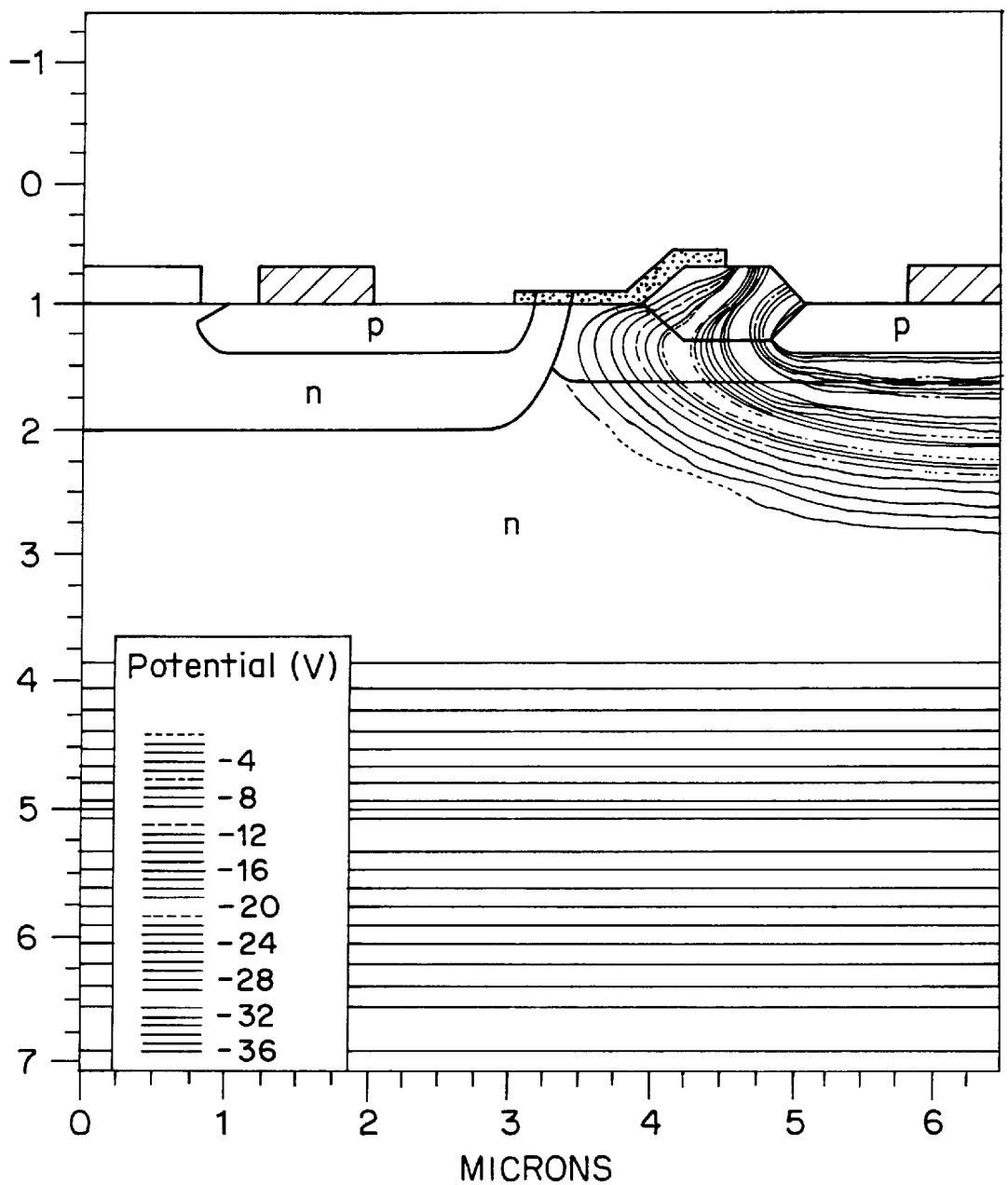
FIG. 4 shows the distribution of potentials in the p-channel type DMOSFET of FIG. 3 during an off period.

FIG. 4 shows the results of a simulation of the distribution of potentials during an off period of the horizontal FET of FIG. 3. These results indicate that no punchthrough occurs in the drain drift region of high concentration.

This invention can be used not only as a unitary FET but as FET in a power IC integrated with a logic section.

Other modification of the invention will occur to those skilled in the art and it is intended that the scope of the invention be limited only as set forth in the appended claims.

We claim:

1. A horizontal field effect transistor comprising:

a semiconductor substrate of a first conductivity type;

a well region of a second conductivity type formed in a surface layer of the substrate;

a source region of the first conductivity type formed in the well region;

a drain region of the first conductivity type formed in the well region separated from the source region;

a gate electrode disposed via a gate insulating film on a top surface of the substrate between the source region and the drain region;

a source electrode disposed to contact a surface of the source region;

a drain electrode disposed to contact a surface of the drain region; and a first and a second offset region of the first conductivity type formed to contact the drain region, wherein an end of the first offset region and an end of the second offset region, close to the source region, are offset from each other, and wherein the first offset region has a lower impurity concentration than the second offset region and extends from said drain region to a base region formed in said well region.

2. The horizontal field effect transistor of claim 1 wherein the first offset region extends closer to the source region than does the second offset region.

3. The horizontal field effect transistor of claim 2 wherein a thick insulating film for reducing electric fields is disposed under the gate electrode, close to the drain region.

4. A method for manufacturing the horizontal field effect transistor of claim 3, comprising the steps of:

forming an oxide film and a nitride film on a silicon substrate;

using a thick insulating film formation mask to remove the nitride film selectively;

injecting impurity ions through a window formed to form the first offset region; and undertaking thermal treatment in an oxidized atmosphere to form the second offset region and forming the thick insulating film on the surface of the second offset region.

5. The horizontal field effect transistor of claim 3 wherein the second offset region is formed mainly under the thick insulating film.

6. The horizontal field effect transistor of claim 5 wherein the thick insulating film is formed at the same time as is formed a thick insulating film for separating other elements of said transistor from one another or for preventing inversion.

7. The horizontal field effect transistor of claim 1 wherein a thick insulating film for reducing electric fields is disposed under the gate electrode, close to the drain region.

8. The horizontal field effect transistor of claim 7 wherein the second offset region is formed mainly under the thick insulating film.

9. The horizontal field effect transistor of claim 8 wherein the thick insulating film is formed at the same time as is formed a thick insulating film for separating other elements of said transistor from one another or for preventing inversion.

10. A method for manufacturing the horizontal field effect transistor of claim 7, comprising the steps of:

forming an oxide film and a nitride film on a silicon substrate;

using a thick insulating film formation mask to remove the nitride film selectively;

injecting impurity ions through a window formed to form the first offset region; and undertaking thermal treatment in an oxidized atmosphere to form the second offset region and forming the thick insulating film on the surface of the second offset region.

* * * * *